United States Patent
Bertin (10) Patent No.: US 10,038,426 B2
(45) Date of Patent: Jul. 31, 2018

(54) TEMPERATURE COMPENSATED CONSTANT CURRENT SYSTEM AND METHOD

(71) Applicant: SEMICONDUCTOR COMPONENTS INDUSTRIES, LLC, Phoenix, AZ (US)

(72) Inventor: Jacques Jean Bertin, Pocatello, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 108 days.

(21) Appl. No.: 15/220,327

(22) Filed: Jul. 26, 2016

(65) Prior Publication Data

US 2018/0034447 A1 Feb. 1, 2018

(51) Int. Cl.
- *H01L 35/00* (2006.01)
- *H01L 37/00* (2006.01)
- *H03K 3/42* (2006.01)
- *H03K 17/78* (2006.01)
- *H03K 3/011* (2006.01)
- *G05F 3/26* (2006.01)

(52) U.S. Cl.
CPC ............ *H03K 3/011* (2013.01); *G05F 3/265* (2013.01)

(58) Field of Classification Search
CPC . H03K 3/00; H03K 3/01; H03K 3/011; G05F 3/26; G05F 3/262; G05F 3/265; G05F 3/267

USPC .......................................... 327/509, 512, 513
See application file for complete search history.

(56) References Cited

U.S. PATENT DOCUMENTS

| | | | |
|---|---|---|---|
| 7,777,475 B2* | 8/2010 | Sperling | G05F 3/30 323/314 |
| 2002/0013997 A1* | 2/2002 | Dunn | H05K 1/167 29/620 |
| 2007/0080740 A1 | 4/2007 | Berens et al. | |
| 2008/0084240 A1 | 4/2008 | Passerini et al. | |
| 2010/0086991 A1* | 4/2010 | Fish | B01J 19/0093 435/286.1 |
| 2011/0169553 A1 | 7/2011 | Wadhwa et al. | |
| 2011/0248747 A1 | 10/2011 | Huang | |
| 2014/0152348 A1 | 6/2014 | Hu et al. | |

* cited by examiner

*Primary Examiner* — Lincoln Donovan
*Assistant Examiner* — Diana J Cheng
(74) *Attorney, Agent, or Firm* — Robert F. Hightower (57) ABSTRACT

A current reference circuit includes a voltage generating device, a resistor, one or more diodes, and a thermal bridge including one or more metal alloy contacts disposed on a substrate. The voltage generating device and the resistor have similar temperature coefficients. The diodes are thermally connected to the voltage generating device through the substrate. The metal alloy contacts are coupled between the diodes and the resistor. The diodes form a reverse bias junction when the compensation circuit is energized such that the thermal bridge may provide thermal conduction between the voltage generating device and the resistor.

19 Claims, 7 Drawing Sheets

FIG. 7B ations as shown in FIGS. 3A and 3B.

TEMPERATURE COMPENSATED CONSTANT CURRENT SYSTEM AND METHOD

TECHNICAL FIELD

Aspects of the present disclosure relate to electronic circuits and, in particular, to a temperature compensated constant current system and method.

BACKGROUND

Integrated circuits (ICs) often require a constant current source (e.g., a current reference) that is both accurate and stable with respect to temperature and variations in manufacturing process. In some cases, constant current sources are implemented using a level shift stage between a feedback amplifier and a bandgap reference (BGR) voltage source in order to increase the temperature operating range. Additionally, these constant current sources may be implemented with a transistor, such as a n-channel metal oxide semiconductor (NMOS) transistor, that is configured to operate as a resistor that compensates for changes in temperature.

SUMMARY

According to one aspect, a current reference circuit includes a voltage generating device, a resistor, one or more diodes, and a thermal bridge including one or more metal alloy contacts disposed on a substrate. The voltage generating device and the resistor have similar temperature coefficients. The diodes are thermally connected to the voltage generating device through the substrate. The metal alloy contacts are coupled between the diodes and the resistor. The diodes form a reverse bias junction when the compensation circuit is energized such that the thermal bridge may provide thermal conduction between the voltage generating device and the resistor.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Embodiments of the present disclosure provide a circuit, which may be monolithic, that provides a constant current output in the presence of changes in temperature. In one specific example, the circuit uses a resistor that is thermally coupled to the transistors of a proportional to absolute temperature (PTAT) circuit. The resistor has a temperature coefficient that is similar to that of the PTAT circuit for collectively providing a temperature current level from the circuit that may otherwise be affected by increases or decreases in temperature. Although conventional current reference techniques have often involved the use of polysilicon materials, the polysilicon material resistance has been shown to drift over time as, for example, the face that the polysilicon material can be susceptible to diffusion of hydrogen over time, thus changing its resistance value and causing drift over time. Embodiments of the present disclosure provide a solution to this problem, by providing a resistor made of a material, such as metal, that is relatively impervious to diffusion effects, and thermally coupling the resistor to the drive transistors of the constant current circuit so the temperature of the resistor may be maintained relatively similar to that of the drive transistors and thereby compensate for changes in temperature.

Advances in technology have driven the need for current measurement devices with ever increasing precision. For example, newer automobile designs are now developed with shifting mechanisms that are controlled by electronic circuits with current sources that are often required to maintain a precision of +/−0.25 percent over a relatively broad range of operating temperatures (e.g., −40 to +150 degrees Celsius). In automatic transmissions, the gears are selected by solenoid controlled hydraulic pressure. The solenoids are, in turn, controlled by current signals, which should be relatively precise for proper operation of the transmission. Moreover, the current signals should be stable over time (e.g., over the lifetime of the vehicles in which the transmissions are installed). To achieve that level of current accuracy, a current reference with low drift over temperature and time may be beneficial. Additionally, because the reference current circuit is typically embedded in a monolithic high power dissipating integrated circuit, the reference should also be immune to thermal gradients that often develop across the substrate.

Conventional solutions to this problem have involved the use of a low drift voltage reference, such as a bandgap reference that is applied across a low drift resistor. While low drift bandgap circuits can be realized, it has been noticed that the resistor often drifts significantly over time. Hydrogen diffuses between the silicon oxide dielectric and the polysilicon resistor, and this diffusion alters the resistance such that the reference current drifts with the resistance over time.

Figure 1A:
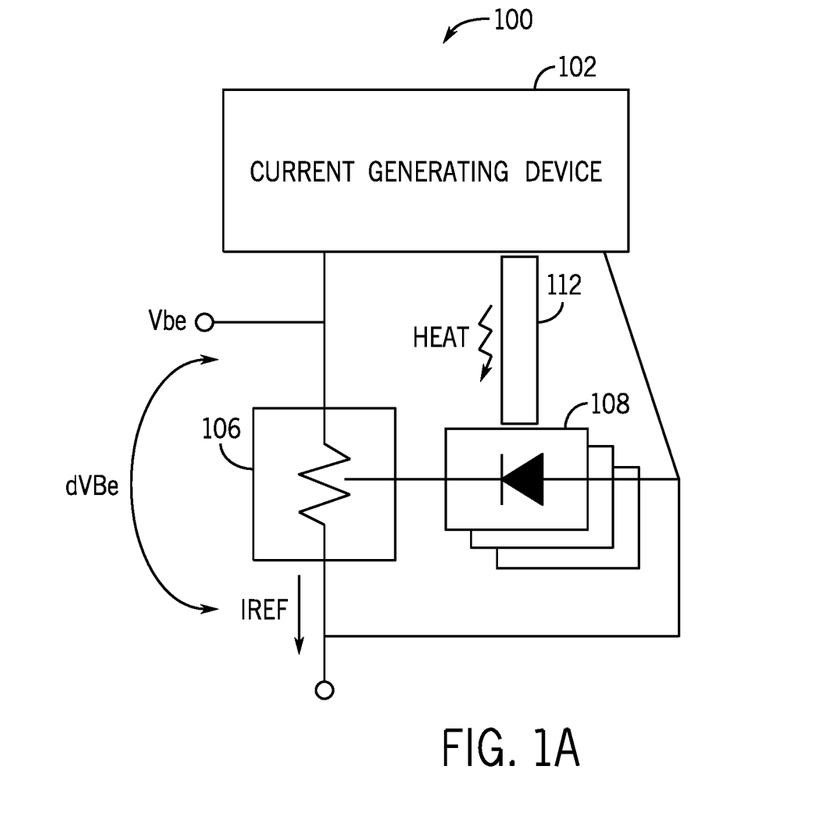
FIG. 1A illustrates an example current reference circuit according to one embodiment of the present disclosure.

FIG. 1A illustrates an example current reference circuit 100 according to one embodiment of the present disclosure. The current reference circuit 100 generally includes at least one voltage generating device 102 that generates a delta base-emitter voltage (ΔVbe), which is proportional to the absolute temperature of the voltage generating device 102. The current reference circuit 100 also includes a resistor 106 that is thermally coupled to the voltage generating device 102 using one or more diodes 108 that convey heat between the voltage generating device 102 and the resistor 106 using one or more metal alloy contacts 112. The diodes 108 keep the voltage generating device 102 and the resistor temperatures close so that thermal gradients may be reduced. Because the resistor 106 has a resistance that is relatively proportional to absolute temperature and the bipolar circuit generates a voltage that is also proportional to absolute temperature, the current reference circuit 100 generates a reference current (Iref) that remains relatively constant over time and temperature.

When the current reference circuit 100 is energized, the diodes 108 are reversed biased so that they may have little or no effect upon the electrical operation of the circuit. The diodes 108 may be formed of materials, such as n-doped and p-doped materials, that can be thermally conductive, and are electrically configured in the circuit so that they contribute relatively little to the circuit's electrical operation. That is, when the current reference circuit 100 is energized, the reverse bias junction of the diodes 108 ensures that the diodes are void of any substantial operational role in the circuit. Thus, the effect of the diodes 108 are to form a thermal bridge between the voltage generating device 102 and the resistor 106 for equalizing a temperature between the voltage generating device 102 and the resistor 106 such that a reference current (Iref) is maintained at an essentially constant level. Stated differently, resistor 106 and the voltage generating device 102 has a relatively similar thermal coefficient so a reference current (Iref) may be generated that is constant over changes in temperature.

In one embodiment, the resistor 106 is formed of metal, such as aluminum alloy. Metal resistors have been shown to be less susceptible to contamination compared with polysilicon resistors. The temperature coefficient of metal resistors is about 3460 ppm/K at 300K. However, metal resistors have a temperature coefficient that is an order of magnitude higher than polysilicon resistors so its use with a bandgap voltage reference may be difficult to implement. The temperature coefficient of the bandgap voltage reference is low, while the temperature coefficient of the metal resistor is high so the resulting current may have a relatively high temperature coefficient. Thus, having the bandgap voltage reference with the metal resistor at the same temperature may not provide a viable solution; the current temperature coefficient is high and needs to be compensated with an additional circuit. Because of the high temperature dependency, the temperature measurement and compensation must be precise which can be difficult to achieve. Thus, using a metal resistor may be used with a voltage reference having the same, or relatively similar, temperature coefficient as the metal. Embodiments of the present disclosure provide a solution to this problem by utilizing diodes 108 that form a thermal bridge between the transistors 104a and 104b and the resistor 106 so that their effective temperatures may be maintained at an essentially similar level.

Figure 1B:
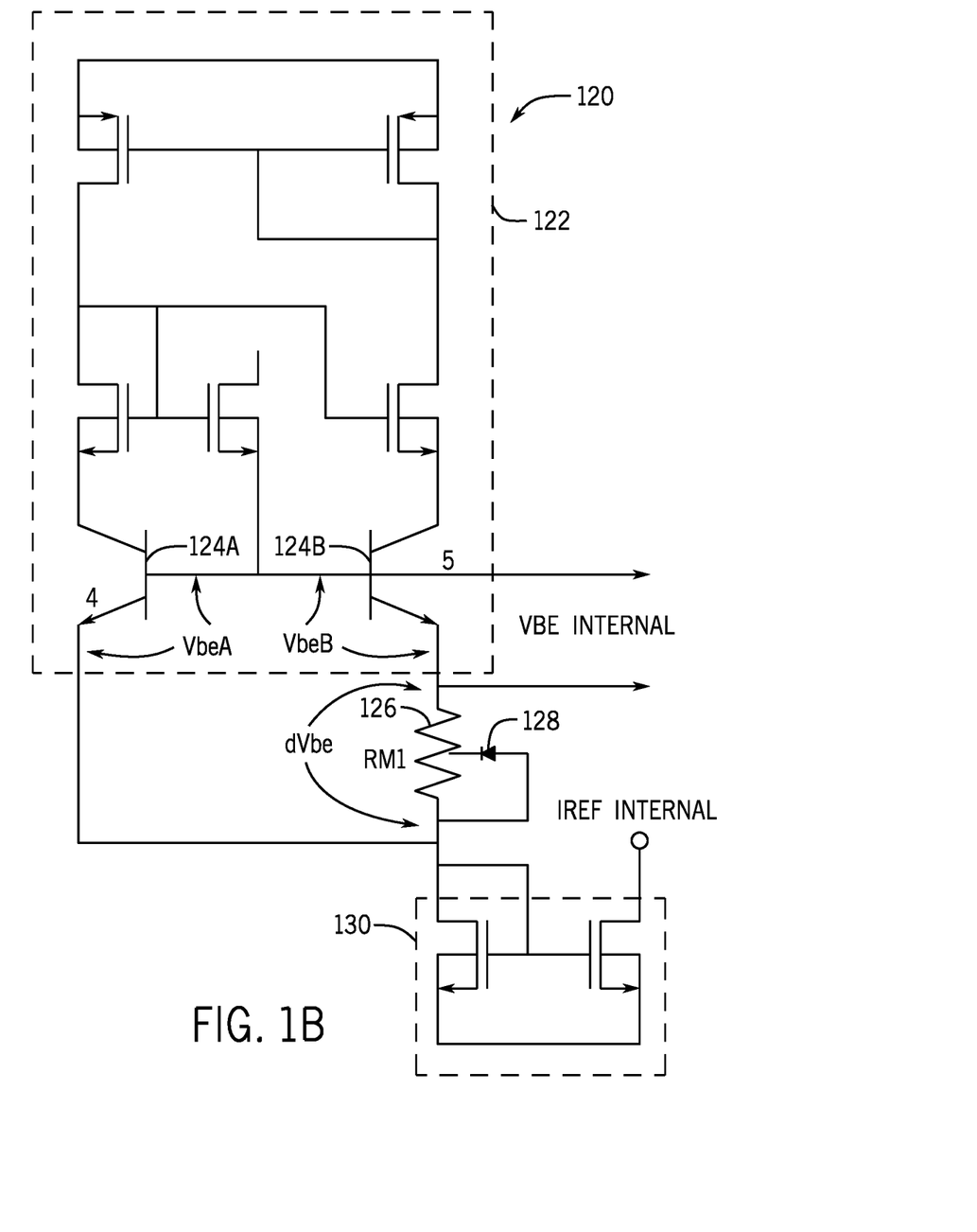
FIG. 1B illustrates an example electrical implementation of the current reference circuit of FIG. 1 according to one embodiment of the present disclosure.

FIG. 1B illustrates an example current reference circuit 120 that is an electrical implementation of the current reference circuit 100 of FIG. 1A. In general, the current reference circuit 120 includes a PTAT circuit 122, a resistor 126, and diodes 128 that are functionally similar to the at least one voltage generating device 102, resistor 106, and diodes 108, respectively, of FIG. 1. The PTAT circuit 122 has first and second bipolar transistors 124a and 124b that operate at different current densities to form a difference of base-emitter voltages (ΔVbe), which is each proportional to the absolute temperature of the bipolar transistors.

The current reference circuit 120 also includes a resistor 126 that is thermally coupled to bipolar transistors 124a and 124b using one or more diodes 128 that convey heat between the bipolar transistors 104a and 104b and the resistor 106. The current reference circuit 120 also includes a current mirror 130 that generates a output reference current source (Iref mirror) that mirrors the reference current (Iref) through the resistor 126.

Although one example electrical implementation of the reference current source 120 is shown, it should be understood that the reference current source 120 may be implemented with additional, fewer, or different types of electrical components than what is shown herein. For example, the reference current source 120 may include a buffer circuit in lieu of the current mirror 130 for buffering the reference current (Iref) outputted by the reference current source 120. As another example, the reference current source 120 may include other components, such as one or more capacitors or one or more inductors for filtering noise from the reference current source 120.

Figure 2:
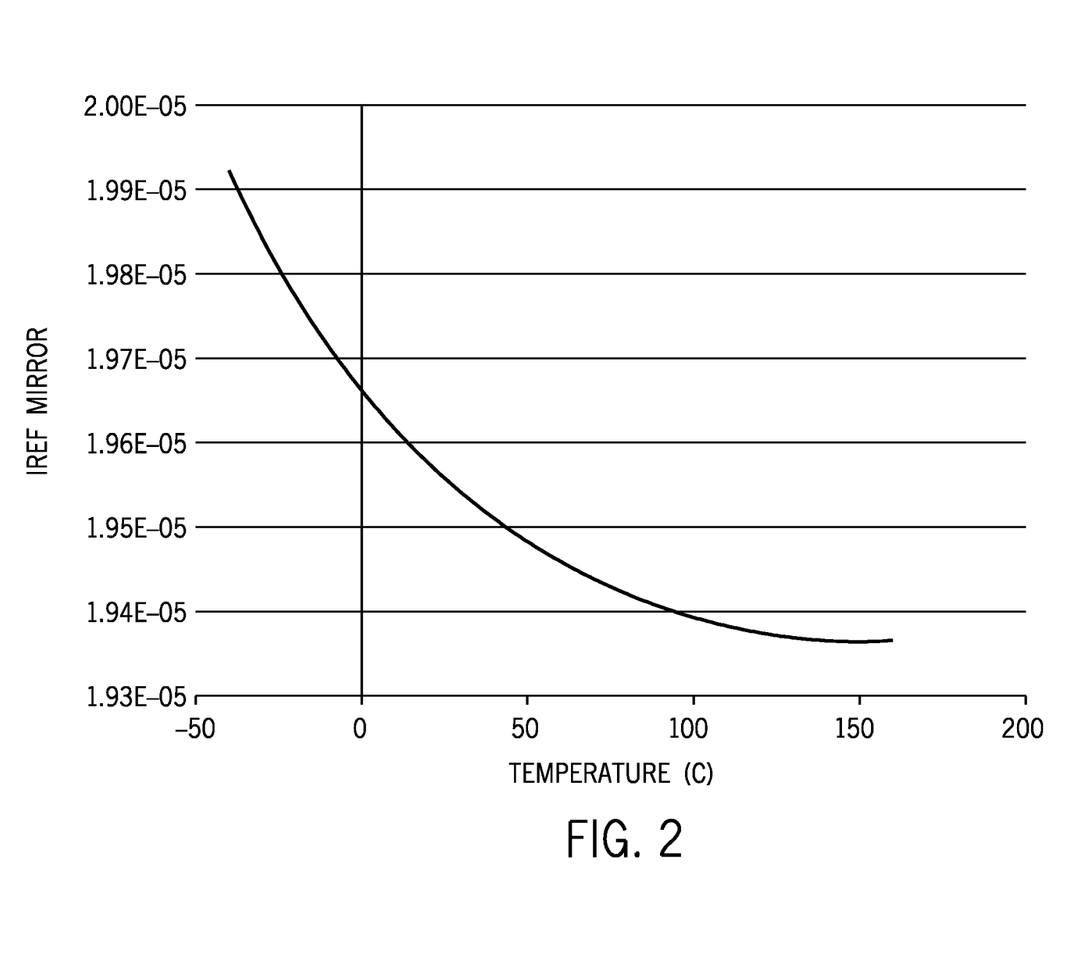
FIG. 2 illustrates an example of a current reference curve that may be exhibited by a transistor fabricated using a typical process according to one embodiment of the present disclosure.

FIG. 2 illustrates an example of a current reference curve that may be exhibited by a transistor fabricated using a typical process according to one embodiment of the present disclosure. The PTAT circuit 122 generates a voltage proportional to its absolute temperature by forcing two identical currents through the base-emitter junction of two bipolar transistor (or two diodes) with different area. The voltage difference (ΔVbe) between the two junctions is in the form:

$$\Delta Vbe = k\,T/q\,\ln(N)$$

Where k is the Boltzmann constant, T is the absolute temperature, q is the charge of the electron and N is the area ratio between the two junctions.

The voltage difference (ΔVbe) is voltage is proportional to the absolute temperature (PTAT) and in most cases, has been proven to exhibit a relatively low level of drift over time. Assuming a linear temperature coefficient (TC1) for the resistor (RM1) 106:

$$RM1 = R0(1 + TC1(T - T0))$$

and a delta base emitter junction voltage (ΔVbe) for the voltage reference, the current flowing through the resistor is ΔVbe/RM1 or:

$$Iref = \frac{1}{R0 + R0\,TC1(T - T0)} \frac{kT}{q} \ln(N)$$

If the temperature coefficient is:

$$TC1 = \frac{1}{T0} = 3333 \text{ ppm/K}$$

Then the current may be constant over temperature:

$$Iref = \frac{T0}{R01}\frac{k}{q}\ln(N)$$

The metal temperature coefficient is close to the 3333 ppm/K that is needed. Given a current source with N ratio equal to a value of 5/4 (e.g., the current ratio between the two transistors 124a and 124b of the PTAT circuit 122) and the metal resistor 106 formed with approximately 4000 sheets shows that the current drift may be maintained within +/−2 percent (%). The worst case temperature coefficient may be approximately −375 ppm/K at low temperatures, which is comparable to the polysilicon resistor. At higher temperatures, the temperature coefficient decreases and can reach 0 at approximately 150 degrees Celsius. Although an example current source with an N ratio equal to 5/4, any ratio could work as this ratio can change with different processes and by using different types of materials for the various components of the current reference circuit 100.

In one embodiment, the circuit 100 may be calibrated over temperature in order to achieve greater precision (e.g., lower drift over temperature and time). In many cases, calibration of the circuit 100 may allow the current drift value of +/−2 percent to be reduced to less than +/−0.25%. One example of a suitable form of calibration may involve measuring the base emitter junction voltage over temperature, which is typically about −2 mV/K, and adjusting the output using any suitable analog or digital correction circuit.

If the temperature of the metal resistor 106 is not equal to the temperature of the voltage reference, an error on the calibrated current may be seen. The relative error (dI/I) of the current is:

$$dI/I = TC1*(Tvref - Tres)$$

Therefore, it may be that the temperature of the metal resistor 106 be as close as possible to the voltage reference temperature. Additionally, a horizontal temperature gradient across the transistors 104a and 104b can be mitigated by symmetrical physical layout of the transistors 104a and 104b.

Typically, the transistors 104a and 104b and the metal resistor 106 will not be fabricated at the same level. Rather, the metal resistor 106 is formed above the transistors 104a and 104b with a silicon oxide layer between the two. As a consequence, a vertical temperature gradient may be generated between the transistors 104a and 104b and the metal resistor 106, which, in some cases, compensation can be difficult. This gradient may be caused by the limited thermal conductivity of the silicon oxide layer, and can be exacerbated by the on-chip thermal dissipation of other circuitry (e.g., power transistors or other devices) fabricated on the monolithic substrate. Although it may be beneficial to minimize thermal gradients due to power dissipation, it may be difficult to nullify. A larger substrate for the monolithic chip can be implemented, but this can be an expensive alternative, which is often not a viable solution.

Herein below, several example calculations are provided to show how the current reference circuit 100 may be realized using standard silicon processing techniques. Nevertheless, it should be understood that other calculations may provide other results without deviating from the spirit and scope of the present disclosure. If decreasing the power dissipation is not a viable option, then the thermal conductivity between the metal resistor 106 and the base emitter junctions of the transistors 124a and 124b can be optimized. The thermal conductivity of intermediate silicon oxide layer is about 1.3 W/m/K while silicon conductivity is 149 W/m/K and aluminum is 205 W/m/K. Considering a polysilicon resistor with dimension of approximately 0.25 micro-meters (um) by 0.9 um. With the silicon oxide layer having a thickness of 0.4 um yields a thermal conductivity that is roughly:

$$\frac{1.3}{mK}\frac{W}{}\frac{0.25\text{ um} \times 0.9\text{ um}}{0.4\text{ um}} = 0.73 \text{ uW/K}$$

For the current reference circuit 100 to provide similar robustness against vertical temperature gradients compared to conventional current reference circuit's using polysilicon resistors, the thermal conductivity should be an order of magnitude higher because the metal resistor 106 temperature coefficient is also an order of magnitude higher. With the metal resistor 106 formed to have dimensions of 0.25 um by 0.9 um on field oxide, the thermal conductivity between a metal resistor 106 and the transistors 104a and 104b would be:

$$\frac{1.3}{mK}\frac{W}{}\frac{0.25\text{ um} \times 0.9\text{ um}}{1.01\text{ um}} = 0.29 \text{ uW/K}$$

By placing a diffusion in the substrate under the metal resistor 106, the silicon oxide thickness is decreased such that the thermal conductivity may be increased to:

$$\frac{1.3}{mK}\frac{W}{}\frac{0.25\text{ um} \times 0.9\text{ um}}{0.7\text{ um}} = 0.42 \text{ uW/K}$$

A value that still does not provide sufficient thermal conductivity to warrant use of metal resistors in lieu of polysilicon resistors as is the conventional practice.

Figure 3A:
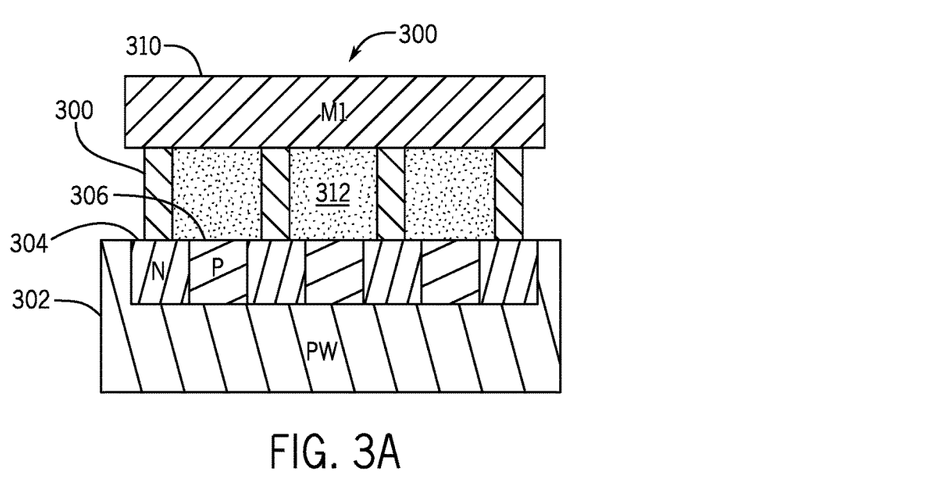
FIGS. 3A and 3B illustrate a side cross-sectional view, and top view, respectively, of an example physical arrangement of certain components of the temperature compensation circuit according to one embodiment of the present disclosure.
Figure 3B:
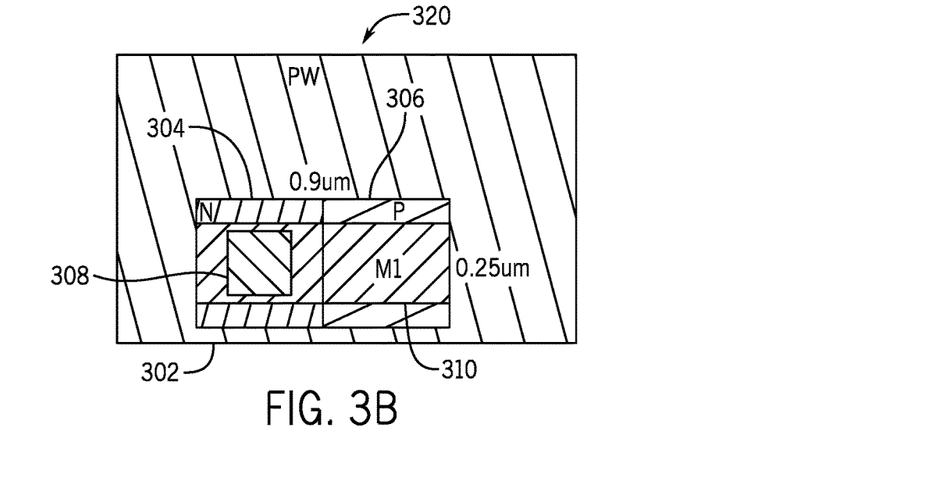

FIGS. 3A and 3B illustrate a side cross-sectional view, and top view, respectively, of an example fabricated semiconductor circuit of certain components of the current reference circuit 100 according to one embodiment of the present disclosure. In particular, the semiconductor shows a substrate 302 (e.g., p-well (PW)) on which alternating negative (N) doped regions 304 and positive (P) doped regions 306 are formed in which the interface between regions 304 and 306 form multiple diodes, such as the diodes 128 of FIG. 1B. The N doped region allows formation of a metal contact 308 between the top of the N doped region 304 and the bottom of resistor 310 that is similar to the resistor 126 of FIG. 1B. Moreover, multiple metal contacts 308 are formed on each N-doped region 304 for forming a thermal bridge between the elongated metal resistor 310 and one or more transistors, such as transistors 124a and 124b (not shown), formed in the p-well (PW). Additionally, silicon oxide 312 may be included to aid in providing electrical insulation between the resistor 310 and the diodes formed by regions 304 and 306. In some cases, each diode's isolation may be accomplished by ensuring that each N doped region is completely surrounded by a P doped region. Although diodes are shown herein, it should be understood that any suitable type of diode or other doped material may be used without departing from the spirit and scope of the present disclosure.

Although only four diodes 308 are shown in FIG. 3A and one diode 308 is shown in FIG. 3B, it should be understood that any quantity of diodes 308 may be implemented according to the teachings of the present disclosure. For example, when using a 0.25 micron fabrication process, the elongated metal resistor 310 may be 2 to 4 mili-meters long to provide a resistance of approximately 1 Kilo-ohms. In such a case, when the spacing between each diode 308 is approximately 0.9 microns, approximately 2222 to 4444 diodes 308 may be implemented to provide a thermal bridge between the metal resistor 310 and the transistors 104a and 104b.

Figure 3C:
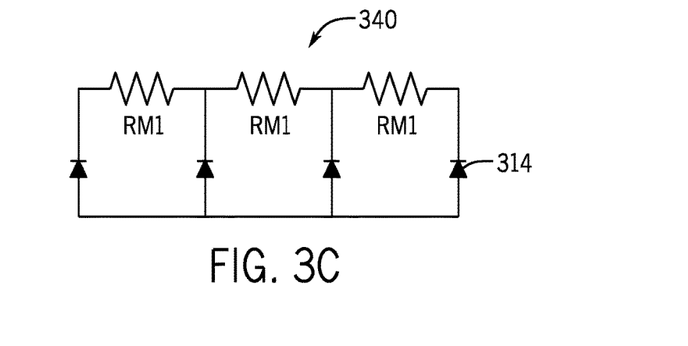
FIG. 3C illustrates an example electrical schematic diagram that may be used to model the physical arrangement as shown in FIGS. 3A and 3B.

FIG. 3C illustrates an example electrical schematic diagram 340 that may be used to electrically model the physical arrangement as shown in FIGS. 3A and 3B. The anodes (e.g., N-doped regions) 304 and cathodes (P-doped regions) 306 form diodes 314, while the resistor 310 forms individual resistance equivalent values (RM1) between each diode 314. The anodes of the diodes 314 are shorted in the p-well 302 while the cathodes are connected along the metal resistor 310. The contacts improve the thermal conductivity. Because the diodes 314 are formed to operate in a reverse bias mode, no undue parasitic affects other than diode leakage current may be incurred. The thermal conductivity is now dominated by the contact 308 and can provide a magnitude of 20 times better that what may be provided by typical polysilicon resistors:

$$\frac{205\ W}{mK} \frac{0.22\ um \times 0.22\ um}{0.7\ um} = 14.2\ uW/K$$

Figure 4A:
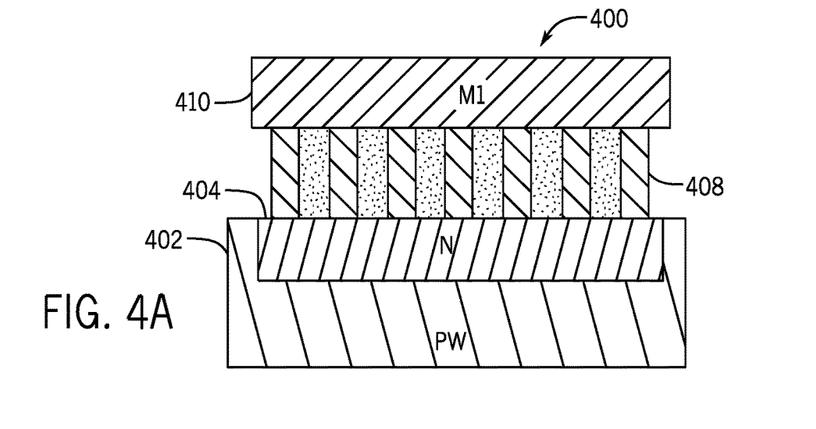
FIGS. 4A and 4B illustrate a side cross-sectional view, and top view, respectively, of another example physical arrangement of certain components of the temperature compensation circuit according to one embodiment of the present disclosure.
Figure 4B:
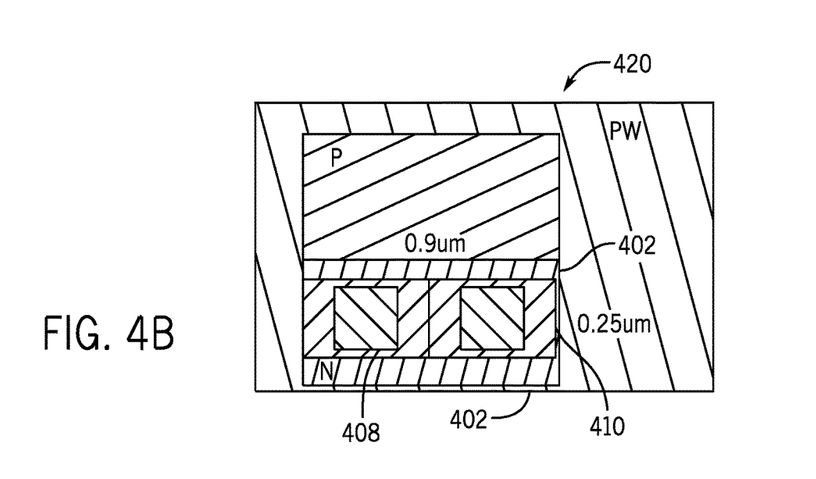

FIGS. 4A and 4B illustrate a side cross-sectional view, and top view, respectively, of another example fabricated semiconductor including certain components of the circuit 100 according to one embodiment of the present disclosure. The semiconductor including the metal resistor 410 and diodes 414 are similar in design and construction to the physical arrangement of the metal resistor 310 and diodes 314 of FIGS. 3A and 3B. The physical arrangement of FIGS. 4A and 4B differ, however, in that a continuous n-doped region 404 is provided for being electrically and thermally coupled to the contacts 408. That is, n-doped region 404 form a thermal bridge between the elongated metal resistor 410 and one or more transistors, such as transistors 124a and 124b (not shown), formed in the p-well (PW). Although only seven contacts 408 are shown in FIGS. 4A and 2 contacts 408 is shown in FIG. 4B, it should be understood that any quantity of contacts 408 may be implemented according to the teachings of the present disclosure.

Figure 4C:
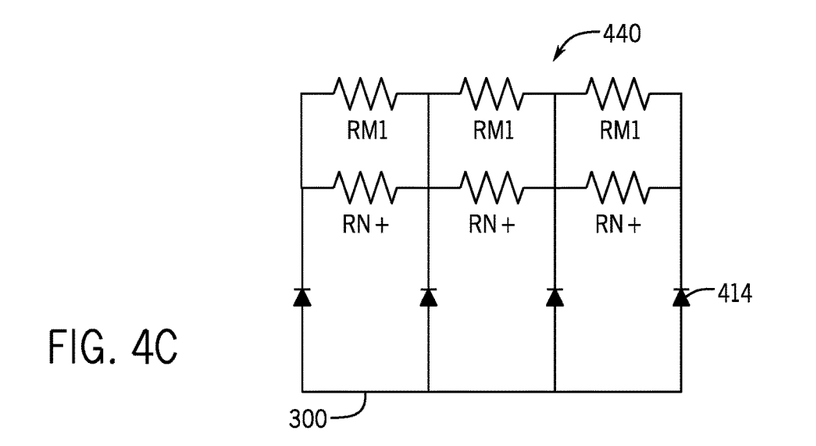
FIG. 4C illustrates an example electrical schematic diagram that may be used to model the physical arrangement as shown in FIGS. 4A and 4B.

FIG. 4C illustrates an example electrical schematic diagram 440 that may be used to model the physical arrangement as shown in FIGS. 4A and 4B. Because the contacts 408 are attached to a single doped region (e.g., n-doped region) 404 of the diodes 414, a parasitic resistance (RN+) may be incurred. However, the electrical conductivity of the metal resistor (RM1) is orders of magnitude higher than the parasitic resistance (RN+) so the adverse effects of the parasitic resistance (RN+) may be essentially negligible. Additionally, in using this configuration, the contact spacing is optimized and the thermal conductivity may be increased by a factor of 2.

Figure 5:
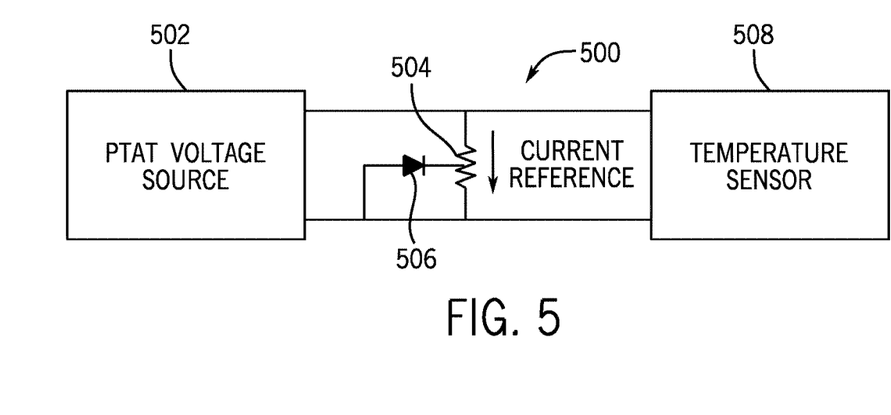
FIG. 5 illustrates an example temperature compensation circuit implemented as a current reference according to one embodiment of the present disclosure.

FIG. 5 illustrates an example of a circuit 500 implemented as a current reference according to one embodiment of the present disclosure. The circuit 500 generally includes a PTAT voltage source 502, a metal resistor 504 (e.g., an elongated metal resistor), and one or more diodes 506 thermally coupling the metal resistor 504 to all the transistors of the PTAT circuit 502 to generate a current reference that is compensated for changes in substrate temperature.

In one embodiment, the PTAT voltage circuit 502, metal resistor 504, and diodes 506 are configured on a monolithic substrate. The metal resistor 504 is configured above and electrically isolated from the monolithic substrate by a silicon oxide layer. In operation, the diodes 506 are reverse biased in order to avoid current flowing through the diodes 506. The diode contacts serve as thermal bridges between the metal resistor and silicon to equalize the ambient temperature of the transistor and metal resistor 504. When the PTAT voltage is applied across the metal resistor 504, the current flowing through the metal resistor 504 provides the reference current with relatively low drift over time, temperature, and thermal gradients.

In one embodiment, a temperature sensor 508 may be used to calibrate the current reference by measuring the reference current at differing temperatures to generate a profile that may be used to implement a correction factor to be applied to current measurements while in operation. For example, measurements across the resistor 504 may be taken while the circuit 500 is subjected to different ambient temperatures. Given these measured values, one or more additional circuits may be used to apply a correction factor for compensating for subtle variations in the measured values over temperature. The one or more additional circuits may be any suitable type, such as a digital processing circuit that inputs digitized measured values of the resistance voltage and applies a correction factor according to its measured values.

Figure 6:
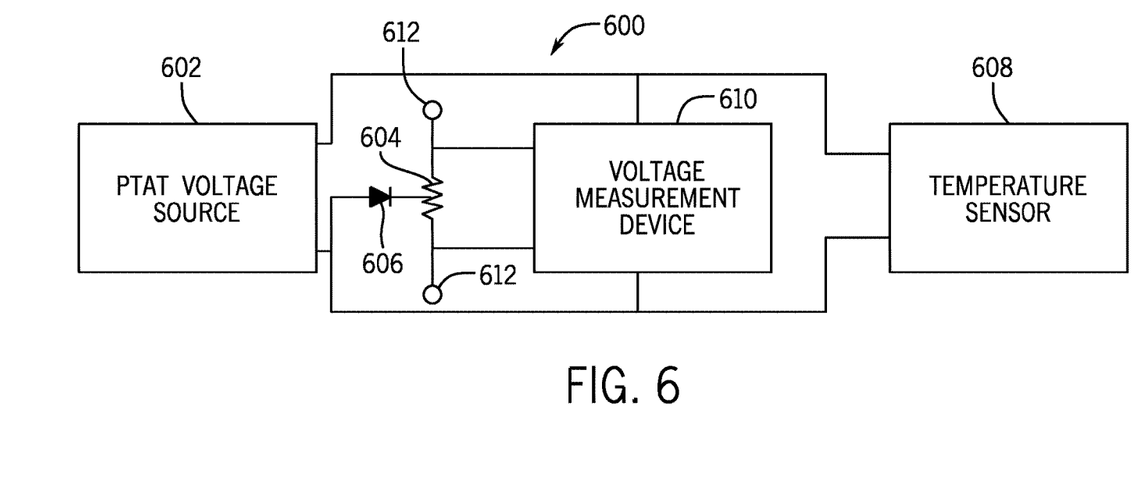
FIG. 6 illustrates an example temperature compensation circuit implemented as a current sensor according to one embodiment of the present disclosure.

FIG. 6 illustrates an example of a circuit 600 implemented as a current sensor according to one embodiment of the present disclosure. The circuit 600 includes a PTAT voltage source 602, a metal resistor 604, one or more diodes 606, and a temperature sensor 608 that are similar in design and construction to the PTAT voltage source 502, a metal resistor 504, one or more diodes 506, and a temperature sensor 508 of FIG. 5. The circuit 600 of FIG. 6 differs, however, in that the circuit 600 includes a voltage measurement device 610 that accurately measures a current flowing through opposing nodes 612 of the resistor 604 using the PTAT voltage source 602 as a voltage reference.

The current to be sensed is proportional to the ratio of the voltage across the resistor 604 and a PTAT voltage generated by the PTAT voltage source 602. The resistor 604 and the transistors in the PTAT voltage source 602 have approximately the same temperature coefficient so the ratio of the voltage across the resistor 604 and the voltage of the PTAT voltage source 602 is relatively proportional to the current through the resistor 604. Thus, the current measured across the resistor 604 may be at least nearly independent of temperature changes. To further alleviate the effects of temperature, the temperature sensor 608 can be used to calibrate the circuit 600. Thus, the current sensor may have relatively low drift over time, temperature, and thermal gradients. Additionally, the sensed current can be converted to a digital signal with an analog to digital (ADC) converter connected to the PTAT voltage source 602 and the metal resistor 604.

Figure 7A:
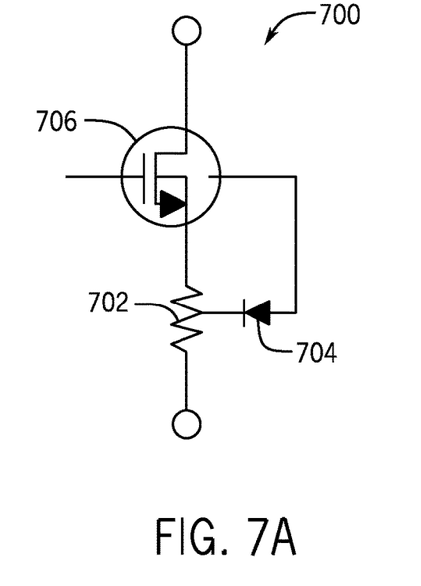
FIGS. 7A and 7B are a schematic diagram and a physical arrangement, respectively, illustrating another example temperature compensation circuit that may be implemented as a current sensor according to one embodiment of the present disclosure.
Figure 7B:
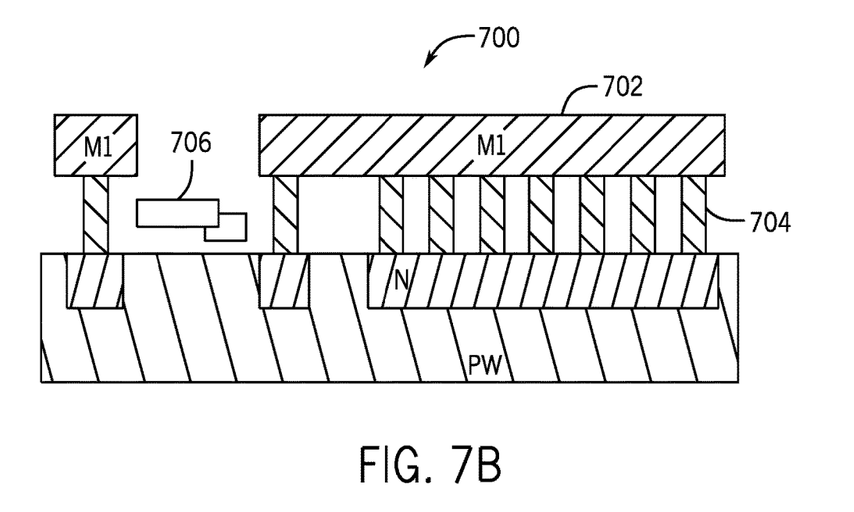

FIGS. 7A and 7B are a schematic diagram and a physical arrangement, respectively, illustrating another example current reference circuit 700 that may be implemented as a current sensor according to one embodiment of the present disclosure. The circuit 700 generally includes a metal resistor 702 and one or more diodes 704 that may be coupled with a high power DMOS transistor 706 to measure the current through the DMOS transistor 706. Although a DMOS transistor 706 is shown and described herein, it should be understood that the circuit 700 may be implemented with any desired voltage generating device, such as a diode, bipolar transistor, a junction field effect transistor, and the like, to measure a current level through that voltage generating device.

To sense the current, the voltage drop across the metal resistor may be measured and compared to a PTAT voltage reference circuit (not shown). Let Vrm1 be the voltage drop across the metal resistor (RM1) caused by the current to be sensed Isense:

$$Vrm1 = Isense * RM1$$

Using a PTAT voltage from the PTAT voltage reference circuit as a reference:

$$VPTAT = kT/q \ln(N)$$

If the temperature coefficient of the metal resistor is equal to 1/T0 then:

$$Isense = \frac{T0}{R01} \frac{k}{q} \ln(N) \frac{Vrm1}{VPTAT}$$

If desired, the sensed current can be converted to a digital signal with an ADC converter. The ADC reference may then be VPTAT, while the ADC converter input would be Vrm1.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A current reference circuit comprising:
a voltage generating device disposed in a substrate, the voltage generating device having a temperature dependent voltage;
a resistor having a proportional temperature dependent resistance proportional to the voltage generating device;
one or more diodes connected to the voltage generating device to thermally couple the resistor to the voltage generating device; and
a thermal bridge comprising one or more metal alloy contacts coupled between the one or more diodes and the resistor, the one or more diodes forming a reverse bias junction when the current reference circuit is energized, wherein the thermal bridge provides thermal conduction between the voltage generating device and the resistor for providing a reference current output wherein each of the metal alloy contacts are thermally coupled to an N-doped region of the one or more diodes.

2. The current reference circuit of claim 1, wherein the resistor is electrically coupled to the voltage generating device such that, when the current reference circuit is energized, the reference current output is generated through the resistor that is compensated according to changes in temperature due to its temperature dependent resistance that is proportional to the voltage generating device.

3. The current reference circuit of claim 1, further comprising a voltage measurement device that measures a voltage across the voltage generating device and a voltage across the resistor, wherein a current level through the resistor is proportional to a ratio of the voltage across the resistor and a voltage generated by the voltage generating device.

4. The current reference circuit of claim 1, wherein the voltage generating device comprises a proportional to absolute temperature (PTAT) circuit.

5. A current reference circuit comprising:
a voltage generating device disposed in a substrate, the voltage generating device having a temperature dependent voltage wherein the voltage generating device comprises a proportional to absolute temperature (PTAT) circuit;
a resistor having a proportional temperature dependent resistance proportional to the voltage generating device;
a diode connected to the voltage generating device to thermally couple the resistor to the voltage generating device wherein the diode includes a plurality of diodes, and the one or more metal alloy contacts comprise a plurality of metal alloy contacts, each of the metal alloy contacts thermally coupled to corresponding N-doped regions of each of the diodes; and
a thermal bridge comprising one or more metal alloy contacts coupled between the plurality of diodes and the resistor, the plurality of diodes forming a reverse bias junction when the current reference circuit is energized, wherein the thermal bridge provides thermal conduction between the voltage generating device and the resistor for providing a reference current output.

6. The current reference circuit of claim 4, wherein the one or more diodes comprise a single diode, and the one or more metal alloy contacts comprise a plurality of metal alloy contacts, each of the metal alloy contacts thermally coupled to an N-doped region of the single diode.

7. The current reference circuit of claim 1, wherein the resistor is formed above the substrate, and the thermal bridge is formed between the resistor and the voltage generating device.

8. The current reference circuit of claim 1, wherein the resistor is formed of an elongated section of metal alloy.

9. The current reference circuit of claim 1, further comprising a temperature sensor to measure the current reference circuit at a plurality of differing temperature levels, and implementing a correction factor, using the differing temperature levels, to be applied to the current reference circuit while in operation.

10. A method comprising:
provided a voltage generating device having a temperature dependent voltage, a resistor having a temperature dependent resistance proportional to the voltage generating device, a diode connected to the voltage generating device to thermally coupled the resistor to the voltage generating device, and a thermal bridge comprising one or more metal alloy contacts coupled between the diode and the resistor;
forming the resistor above a substrate, and forming the thermal bridge between the resistor and the voltage generating device; and
configuring the voltage generating device such that a reverse bias junction is formed in the diode in response to energizing the voltage generating device, wherein the thermal bridge provides thermal conduction between the voltage generating device and the resistor for providing a reference current output.

11. The method of claim 10, further comprising generating the reference current output through the resistor that is compensated according to changes in temperature, wherein the resistor is electrically coupled to the voltage generating device due to its temperature dependent resistance that is proportional to the voltage generating device.

12. The method of claim 10, further comprising configuring a voltage measurement circuit to measure a voltage across the voltage generating device and a voltage across the resistor, wherein a current level through the resistor is proportional to a ratio of the voltage across the resistor and the voltage generated by the voltage generating device.

13. The method of claim 10, wherein the voltage generating device comprises a proportional to absolute temperature (PTAT) circuit.

14. The method of claim 10, further comprising forming the resistor from an elongated section of metal alloy.

15. The method of claim 10, further comprising:
configuring a temperature sensor to measure the current reference circuit at a plurality of differing temperature levels; and
implementing a correction factor, using the differing temperature levels, to be applied to the current reference circuit while in operation.

16. A current reference circuit comprising:
a proportional to absolute temperature (PTAT) circuit disposed in a substrate, the PTAT circuit having a temperature dependent voltage;
a resistor having a proportional temperature dependent resistance proportional to the PTAT circuit, the resistor being electrically coupled to the PTAT circuit and formed from an elongated section of metal alloy;
a diode connected to the PTAT circuit to thermally couple the substrate and the PTAT circuit; and
a thermal bridge comprising one or more metal alloy contacts coupled between the diode and the resistor, the diode forming a reverse bias junction when the current reference circuit is energized, wherein the thermal bridge provides thermal conduction between the PTAT circuit and the resistor for providing a reference current output wherein the metal alloy contacts include a plurality of metal alloy contacts, each of the metal alloy contacts thermally coupled to an N-doped region of the diode.

17. The current reference circuit of claim 16, wherein the diode comprises a plurality of diodes, and the one or more metal alloy contacts comprise a plurality of metal alloy contacts, each of the metal alloy contacts thermally coupled to corresponding N-doped regions of each of the plurality of diodes, wherein when the compensation circuit is energized, the reverse bias junction ensures that the plurality of diodes are substantially void of any operational role in the circuit.

18. The current reference circuit of claim 16, wherein the diode comprises a single diode, and the one or more metal alloy contacts comprise a plurality of metal alloy contacts, each of the metal alloy contacts thermally coupled to an N-doped region of the single diode.

19. The current reference circuit of claim 16, further comprising a temperature sensor to measure the current reference circuit at a plurality of differing temperature levels, and implementing a correction factor, using the differing temperature levels, to be applied to the current reference circuit while in operation.

* * * * *